United States Patent [19]

Tucker

[11] 4,417,770

[45] Nov. 29, 1983

[54] HIGH VACUUM COMPATIBLE AIR BEARING STAGE

[75] Inventor: Theodore W. Tucker, Lincoln, Mass.

[73] Assignee: Control Data Corporation, Minneapolis, Minn.

[21] Appl. No.: 304,228

[22] Filed: Sep. 21, 1981

[51] Int. Cl.³ .................. F16C 32/06; F16C 29/02
[52] U.S. Cl. .................................. 308/3.5; 308/5 R
[58] Field of Search ............ 308/3 A, 3 R, 5 R, 3.5, 308/DIG. 1; 277/212 FB, 226, DIG. 5, 3; 29/DIG. 44, 722, 743

[56] References Cited

U.S. PATENT DOCUMENTS

| | | | |
|---|---|---|---|
| 3,209,623 | 10/1965 | Schardt | 308/DIG. 1 X |
| 3,218,108 | 11/1965 | Sazavsky | 308/5 R |
| 3,520,055 | 7/1970 | Jannett | 27/722 X |
| 3,995,502 | 12/1976 | Jones | 277/212 FB X |
| 4,080,009 | 3/1978 | Marathe et al. | 308/5 R X |
| 4,141,456 | 2/1979 | Hart | 29/406 X |
| 4,191,385 | 3/1980 | Fox et al. | 277/3 |

*Primary Examiner*—Stuart S. Levy
*Assistant Examiner*—David Werner
*Attorney, Agent, or Firm*—Edward P. Heller; Joseph A. Genovese

[57] ABSTRACT

A high vacuum compatible X-Y positioning stage having an air bearing is provided. A pair of moveable carriages is mounted interior to an airtight chamber. Constraints allow movement of each carriage to only one horizontal direction, the directions of each carriage being orthogonal. Air inlet and outlet ports enter the chamber through apertures, and are mounted on the carriages and are moveable therewith. Airtight, flexible bellows form an airtight seal between the chamber and air ports at the apertures. Pressurized air communicated through the ports to the carriage is constrained to exit the carriage via small orifices about the exterior thereof to form an air bearing. The air is constrained to exit the airtight chamber through a passageway mounted in the carriage and leading to the outlet port. A stage is mounted on one pair of ports. The other pair is mounted in a fixed position. The stage is moveable in an X-Y plane vis-a-vis the fixed position on a compensated air bearing.

6 Claims, 5 Drawing Figures

1

HIGH VACUUM COMPATIBLE AIR BEARING STAGE

BACKGROUND OF THE INVENTION

1. Field of the Invention

The present invention relates generally to the field of air or gas bearing structures and more particularly to an air or gas bearing structure compatible with a high vacuum environment.

2. Brief Description of the Prior Art

In the electron semiconductor industry, electron beam devices are used in the manufacture of the semiconductor wafers and masks. Generally speaking, these electron beam devices require a high vacuum environment to perform their function efficiently. Most of these devices mount their target wafers or masks on a moveable platform known as a stage. These stages are normally required to move in an X-Y plane in many minute and precise movements.

There are many problems providing an air bearing in a high vacuum environment. The problems have heretofore been approached by providing the air bearing external to the vacuum chamber with the stage mounted on an arm extending into the vacuum chamber. This solution has the inherent problems of instability at the end of the arm.

Another solution is to provide high vacuum pumps at the periphery of the air bearing to remove the air as it exits the periphery of the air bearing. However this solution is both nonideal and very expensive.

A third solution is provided in U.S. Pat. No. 4,191,385 to Fox, deceased, et al. In this solution the vacuum chamber is provided interior of the air bearing. This solution has the inherent problems of a large massive structure. Minute, precise movements are not indicated.

SUMMARY OF THE INVENTION

The present invention comprises a pair of orthogonally mounted air bearings housed in a sealed high vacuum compatible chamber. Two independently moveable carriages are provided; one carriage is essentially a duplicate of the other. Constraints allow movement of a carriage in one dimension only. An air inlet port is mounted on one side of a carriage, and an air outlet port is mounted on the opposite side. The ports extend through apertures in the chamber housing. Airtight bellows are mounted between the housing and air ports to form the airtight seal therebetween. The bellows are free to flex in the dimension of carriage freedom of movement. Pressurized air enters the interior of a carriage through an inlet port and is constrained to exit through orifices on the four faces of the carriage closely abutting the interior walls of the vacuum chamber. This provides a compensated air bearing for friction free movement. The carriages are separated from each other by a central plate having recesses into which the bellows extend. A stage is mounted on a first moveable pair of air ports exterior the chamber housing; while the other pair of air ports is fixedly mounted. The stage, therefore, is moveable in a horizontal (X-Y) plane vis-a-vis the fixedly mounted air ports.

DESCRIPTION OF THE PREFERRED EMBODIMENT

Figure 1:
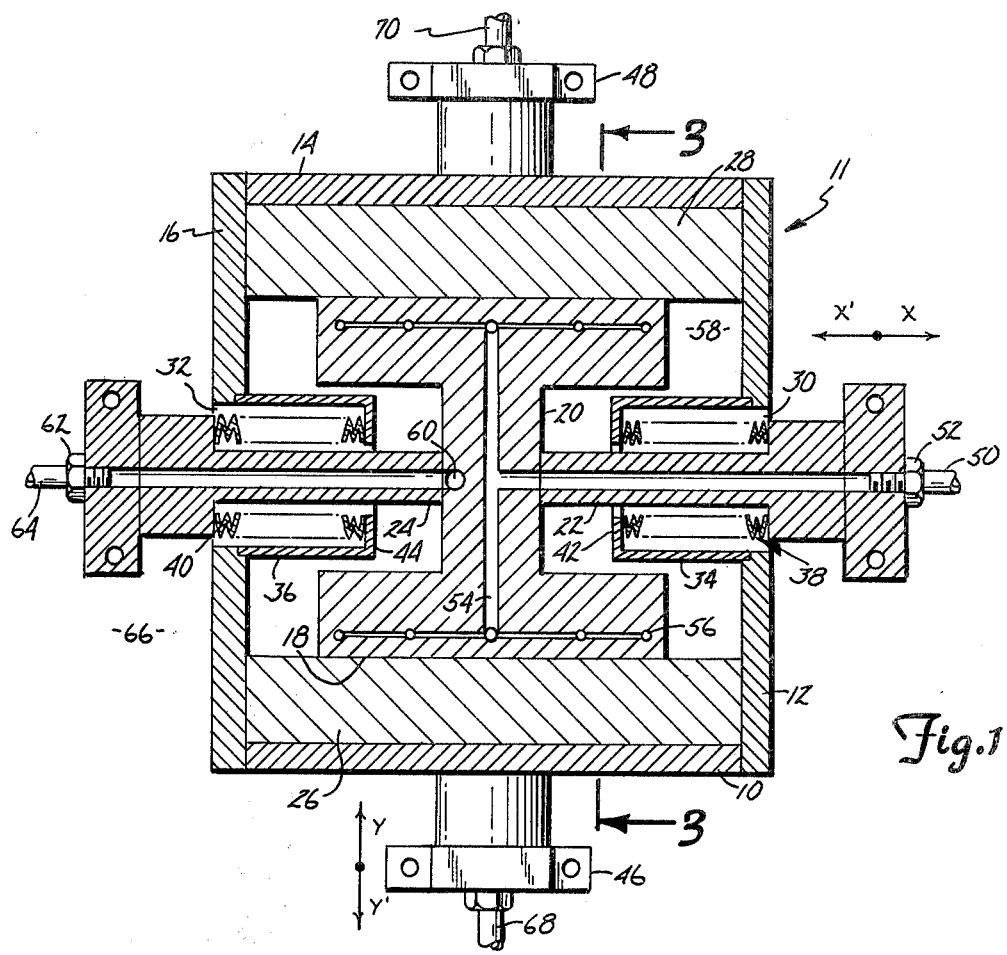
FIG. 1 is a top cross-sectional view of the preferred embodiment.
Figure 3:
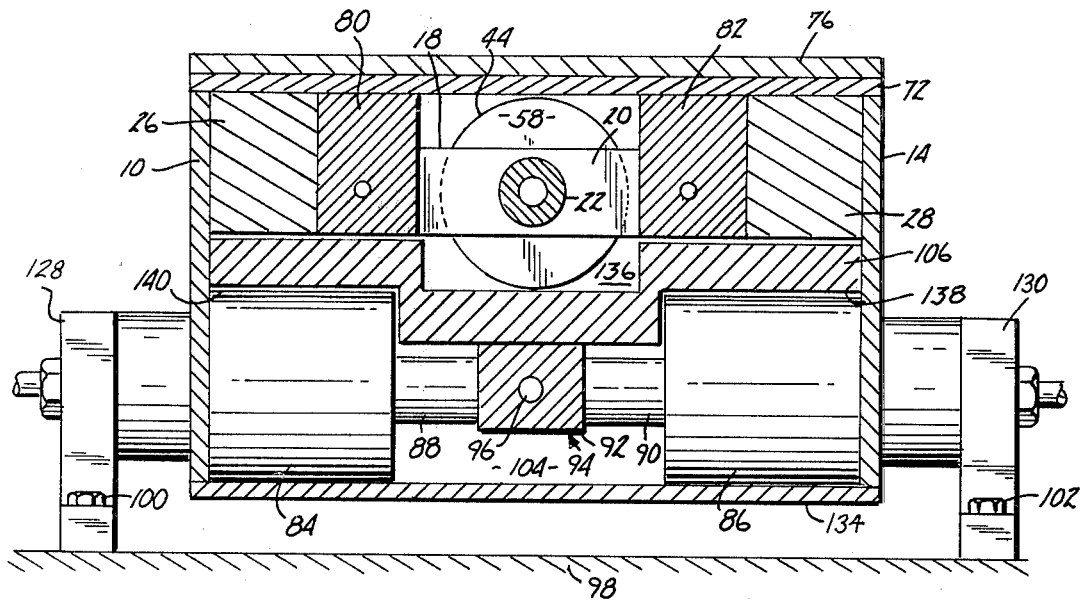
FIG. 3 is a cross-sectional view along 3—3 of FIG. 1.
Figure 4:
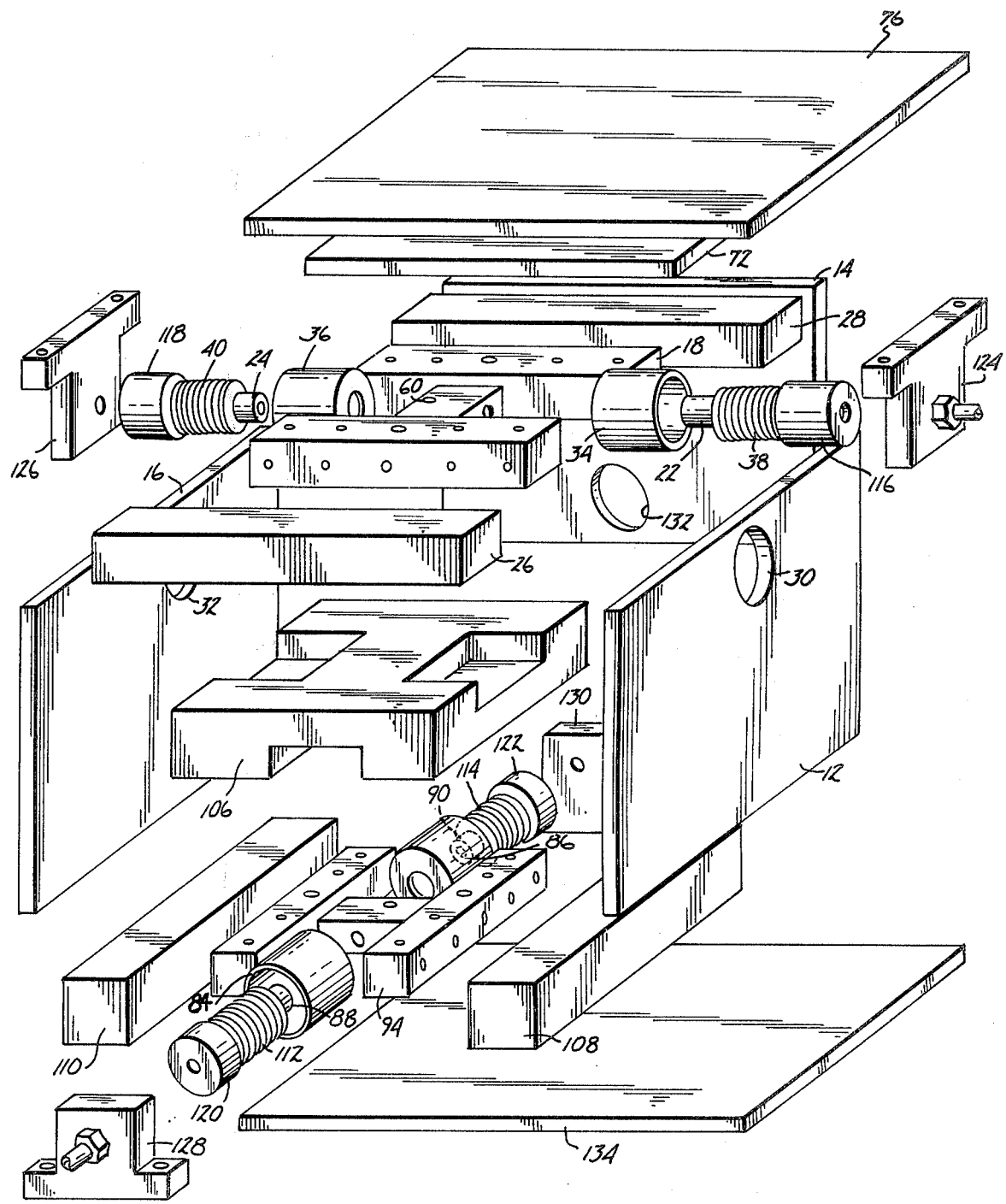
FIG. 4 is a blow-up view of the preferred embodiment.

Referring to FIG. 1, a top cross-sectioned view of the present preferred emboiment is shown. An airtight chamber 11 is formed of side plates 10, 12, 14, and 16 and a top and bottom plate shown in FIGS. 3 and 4. Mounted interior to said chamber is the uppermost of a pair of identical but orthogonally mounted moveable carriages 18. Each carriage has the form of the letter H for reasons which will become apparent infra. Mounted on one side of the central member 20 of the carriage, is an air inlet port 22. This port 22 moves with the carriage 18. Mounted on the other side of the central member 20 is an air outlet port 24, which also moves with the carriage. The carriage's freedom of movement is constrained to one dimension (X) by laterally mounted rails 26 and 28. The directions and distances of freedom of movement are denoted by the vectors X and X'. The air ports 22 and 24 extend through apertures 30 and 32 in the exterior walls 12 and 16 respectively of the chamber 11. Cylindrical brackets 34 and 36 are mounted on the exterior walls 12 and 16 respectively, and extend inwards about the respective air ports 22 and 24. The airtightness of the chamber 11 is maintained by flexible bellows 38 and 40 mounted at one end on the respective air port 22 or 24 and at the other end on an inwards projecting flange 42 and 44 mounted on the inwards end of the respective brackets 38 and 40. The exterior portions of the air ports 88 and 90 of the lower carriage FIGS. 3 and 4 are substantially identical in structure to the exterior ends of air ports 22 and 24.

Air inlet port 22 couples to a source of pressurized air via flexible tubing 50 and mounting means 52. The inlet port 22 communicates this pressurized air to interior passageways 54 mounted inside carriage 18. These passageways communicate the pressurized air to four sets of orifices 56 mounted on the four exterior surfaces of the carriage facing closely adjacent surfaces in the chamber to wit: the carriage surfaces facing the lateral rails 26 and 28 and the carriage surfaces facing the central plate (FIGS. 3, 4 and 5) and the top plate (FIGS. 3 and 4). The interaction of pressurized air between these closely adjacent surfaces creates a well-known compensated air bearing.

Air exiting from between these surfaces enters the interior empty space 58 between the central and top plates. This space 58 comprises a plenum. Due to the reduced dimensions of the carriages' central member 20 (see FIGS. 3 and 4), the air in the plenum 58 is constrained to exit via an aperture 60 in the top of central member 20, through the central member 20, and out outlet port 24. Mounted on the outlet port by mounting means 62 is flexible tubing 64, which conducts the exiting air out of the evacuated environment.

This arrangement of the air bearing is adapted to maintain the vacuum integrity of the space 66 immediately surrounding airtight chamber 11.

The lower carriage, air ports, rails and bellows are identical with the upper carriage 18, etc., except that they are all oriented orthogonally to the upper and are free to move in the direction and distances indicated by the vectors Y and Y' vis-a-vis chamber 11. Air ports 46 and 48 are fixedly mounted vis-a-vis the surroundings. As a result, tubing 68 and 70 need not be flexible.

Figure 2:
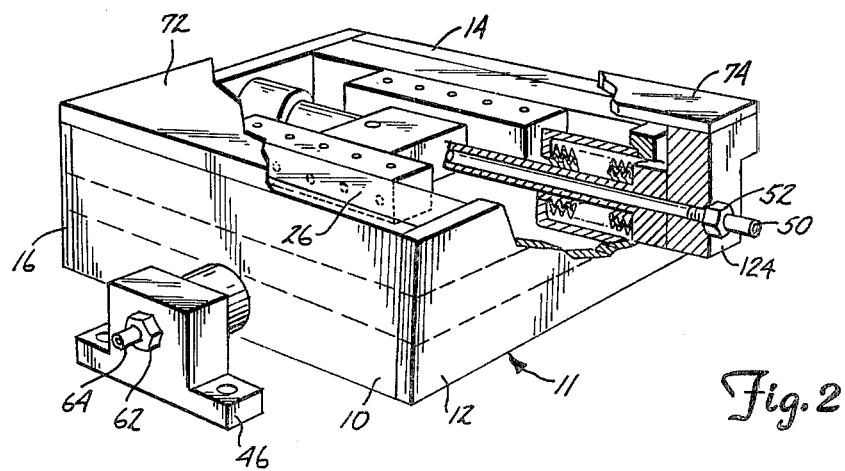
FIG. 2 is a partial cut-away perspective view of the preferred embodiment.

FIG. 2 shows a partial cut-away view of the preferred embodiment. In addition to the features shown and discussed in relation to FIG. 1, the figure shows portions of the top plate 72 and stage 74. The top plate 72 is mounted on the four side walls 10, 12, 14, and 16 to form a fifth wall of the airtight chamber 11. Stage 74 is mounted at one end on air inlet port 22, and at the other end on the air outlet port 24. The lateral extent of the stage, shown in FIG. 2 to be coextensive with the lateral dimensions of the exterior portion of air inlet port 22, may be extended as needed to a wider platform 76 as shown in FIGS. 3 and 4.

Shown also in FIG. 2, in phantom line, are the relative levels of the interfaces between the uppermost carriage, the central plate, and the lower carriage.

FIG. 3 shows a cross section taken along 3—3 of FIG. 1. Shown in the figures are side plates 10 and 14, top plate 72 and bottom plate 134, lateral guide rails 26 and 28, the lateral rail-like members 80 and 82 of carriage 18, the central member 20 of carriage 18, stage 76, lower air inlet and outlet ports 46 and 48 respectively, and air inlet port 22.

New elements shown in the figure are brackets 84 and 86 which surround the lower bellows (FIG. 4), the interior sections 88 and 90 of the lower air inlet and outlet ports respectively, the central member 92 of the lower carriage 94, showing also its pressurized air communicating passageway 96, and the fixed surface 98 upon which mounting means 100 and 102 fixedly mount the air inlet and outlet ports respectively.

The central member 20 of the upper carriage is spaced downwards from the top surface of the respective lateral rail members 80 and 82. This leaves a space 58 which forms a part of the plenum 58 shown in FIG. 4. This space 58 communicates pressurized air to the outlet aperture located atop the upper central member 20.

The lower central member 92 is similarly spaced from its lateral rail members (FIG. 4) to form a space 104 to communicate pressurized air to the outlet aperture (not shown) located on the bottom of the central member.

Figure 5:
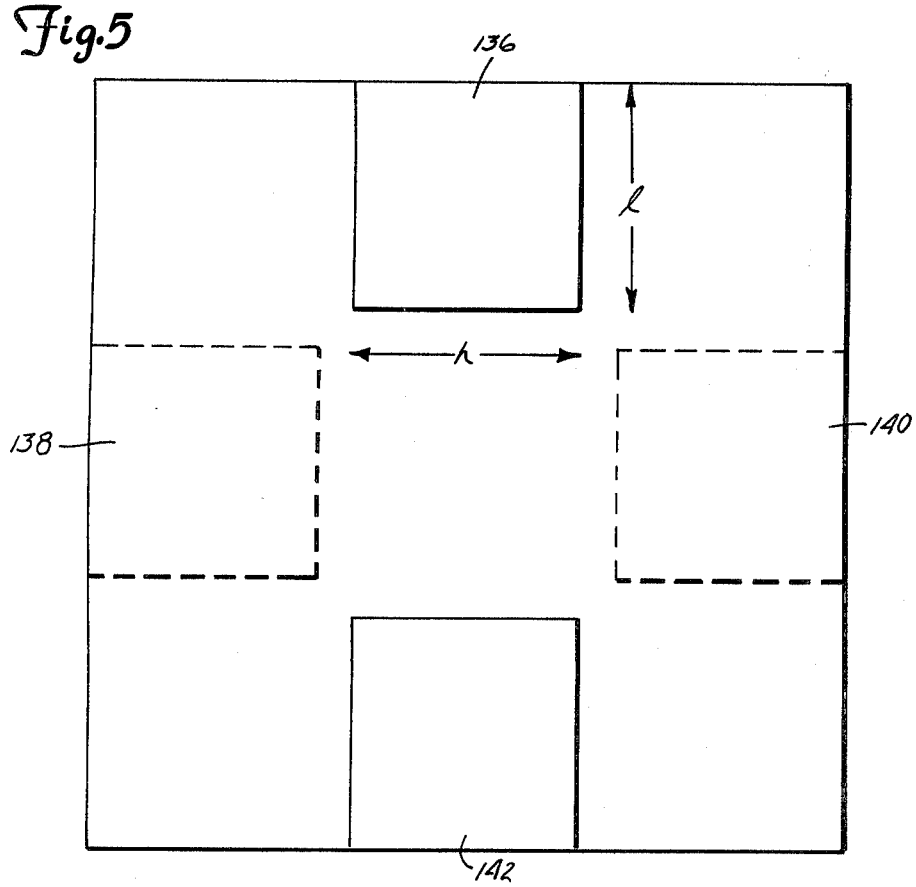
FIG. 5 is a top plan view of the central plate of the preferred embodiment.

Also shown is a central plate 106 having four recesses, 138, 136, 140, and 142 (FIG. 5). These recesses allow interior space for the bellows and their brackets 34 (as shown in the phantom line) to be mounted interior to the chamber 11, thereby saving space.

FIG. 4 shows a blow-up view of the present invention. Shown in the view are stage 76, top plate 72, lateral guide rails 26, 28, 108, 110, carriages 18 and 94, air inlet ports 22 and 88, air outlet ports 24 and 90, bellows 38, 40, 112, and 114, along with the wider anterior end of the ports to which the bellows are mounted 116, 118, 120, 122, stage mounting members 124 and 126 which are mounted on the anterior ends 116 and 118 of the upper ports and to which the stage 76 is mounted, chamber mounting members 128 and 130, which are mounted on the anterior ends 120 and 122 of the lower ports, and which are also mounted on the fixed surface 98, central plate 106, side plates 12, 14 and 16 having apertures 30, 132 and 32, and bottom plate 134. Not shown in the figure for the purpose of clarity are side plate 10, the bellows mounting brackets 34, 36, 84, and 86, as well as miscellaneous mounting means (bolts).

A top plan view of central plate 106 is shown in FIG. 5 to better illustrate the dimensions of the bellows recesses 136, 138, 140, and 142. The dimension "h" is approximately the same as the length of a central member 20 or 92 of a carriage 18 or 94. The dimension "l" is approximately the same as the length of a bellows bracket 34, 36, 84, or 86. And the depth of a recess, from FIG. 3, is approximately one-half the diameter of a bellows bracket 34, 36, 84, or 86, less one-half the thickness of a central member 20 or 92.

The number of orifices on a given air bearing surface in the preferred embodiment is five, as shown in the figures. The number, size and placement of the orifices are a design parameter which may be adjusted to suit the needs of a particular application.

In brief, the operation of the air bearing is as follows: pressurized air from a source external to an evacuated environment is conducted to an air inlet port via the tubing 50 or 68. The air then is forced out the orifices on the exterior surfaces of both carriages 18 and 94 creating two compensated air bearings, with an air buffer existing between a carriage's top, bottom and lateral side surfaces and closely adjacent chamber surfaces. The air then enters a plenum 58 or 104 formed by the airtight chamber 11 in which the carriages are mounted, and exits via an outlet air port 24 or 88 mounted on the carriage. From there the existing air is conducted out of the evacuated environment via tubing 64 and 70.

The airtightness of the chamber is maintained by providing flexible, airtight bellows 38, 40, 112, 114 as interfaces between the relatively moveable port/carriage combinations and the chamber housing (walls and plates 10, 12, 14, 16, 72, 134 and 106).

Constraints 26, 28, 108, and 110 allow each carriage movement in one direction only, each direction being orthogonal to the other. Thus, a stage 76 mounted on one carriage (via the exterior portions 124, 126 of the upper ports) is free to move in a horizontal (X-Y) plane vis-a-vis ground (to which the other ports are afixed).

The description of specific elements of the preferred embodiment is not intended to limit the scope of the appended claims in which

I claim:

1. A high vacuum compatible air bearing comprising:
   an air-tight housing having four apertures;
   two moveable carriages mounted interior said housing, a first carriage having means for constraining its movement to a first direction, and the second carriage having means for constraining its movement to a second direction, the first direction being orthogonal to the second direction;
   a central plate mounted interior said housing intermediate said two carriages;
   two air inlet ports, one each mounted on a carriage and extending through one of said apertures;
   two air outlet ports, one each mounted on a carriage and extending through an aperture;
   a plurality of orifices mounted about the portion of the exterior of each carriage facing closely adjacent surfaces;
   two first communicating passageways, one each mounted interior to each carriage and extending between the air inlet port and each of said orifices;
   two second air communicating passageways, one each extending between the exterior of a carriage, through said carriage and to a outlet port;
   an airtight bellows, flexible in the direction of freedom of movement, mounted between each aperture and the port extending therethrough and forming an airtight seal therebetween; and a source of pressurized air communicated to said air inlet ports; the interfaces between the exterior of said carriages and closely adjacent surfaces forming a compensated air bearing therebetween.

2. The air bearing of claim 1 wherein each of said means for constraining comprises a pair of rails, one each mounted laterally a carriage and parallel to each other.

3. The air bearing of claim 1 or 2 wherein each of said carriages comprises two spaced parallel rails linked by a central member.

4. The air bearing of claim 3 wherein said central plate includes recesses into which said bellows may extend.

5. The air bearing of claim 1 wherein the inlet and outlet ports of a first carriage are mounted on fixed supports; and wherein a stage is mounted exterior to said housing on the inlet and outlet ports of said second carriage; whereby said stage is free to move in an X-Y plane vis-a-vis said fixed supports on a pair of compensated air bearings.

6. The air bearing of claim 1 further including a bellows mounting bracket mounted on said housing about said aperture and extending into the housing interior about the port; said bellows mounted at one end on said port and at the other end on said bracket adjacent said bracket's farthest extension from said aperture.

* * * * *